(12) United States Patent
Ootsuka et al.

(10) Patent No.: US 10,919,099 B2
(45) Date of Patent: Feb. 16, 2021

(54) HAND-HELD DEVICE

(71) Applicant: FANUC CORPORATION, Yamanashi (JP)

(72) Inventors: Yuuma Ootsuka, Yamanashi-ken (JP); Hideki Okamura, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 124 days.

(21) Appl. No.: 16/278,930

(22) Filed: Feb. 19, 2019

(65) Prior Publication Data
US 2019/0262921 A1    Aug. 29, 2019

(30) Foreign Application Priority Data

Feb. 23, 2018    (JP) .................................. 2018-030916

(51) Int. Cl.
*B23H 1/00*    (2006.01)
*B25H 3/04*    (2006.01)

(52) U.S. Cl.
CPC ............... *B23H 1/00* (2013.01); *B25H 3/04* (2013.01)

(58) Field of Classification Search
None
See application file for complete search history.

(56) References Cited

U.S. PATENT DOCUMENTS

| 3,354,073 A | * | 11/1967 | Williams, Jr. | B23H 7/22 |
| | | | | 204/224 R |
| 6,413,022 B1 | * | 7/2002 | Sarh | B21J 15/10 |
| | | | | 408/16 |
| 2011/0114605 A1 | * | 5/2011 | Gold | B23H 1/10 |
| | | | | 219/69.17 |
| 2016/0129582 A1 | * | 5/2016 | Ullrich | B23Q 3/1543 |
| | | | | 408/76 |
| 2018/0211753 A1 | * | 7/2018 | Smith | H01F 7/206 |

FOREIGN PATENT DOCUMENTS

| CN | 201075245 Y | | 6/2008 |
| GB | 1094024 | * | 12/1967 |
| JP | H01295161 A | | 11/1989 |
| JP | 06190771 A | * | 7/1994 |
| JP | 2011-001718 A | | 1/2011 |

(Continued)

OTHER PUBLICATIONS

Machine translation of CN-207771519-U, Aug. 2020.*

(Continued)

*Primary Examiner* — Geoffrey S Evans
(74) *Attorney, Agent, or Firm* — Robert P. Michal, Esq.; Carter, DeLuca & Farrell LLP (57) ABSTRACT

A hand-held device is a portable device configured to be attached to and detached from a metal board, and includes a casing and a magnet disposed in the casing. The hand-held device further includes a moving unit disposed so as to surround the magnet when an attachment face of the casing that is attached to the metal board is viewed from the front, the moving unit being configured to move so as to extend in a direction in which a distal end portion of the moving unit moves away from the attachment face of the casing when the casing is detached from the metal board.

3 Claims, 9 Drawing Sheets

(56) References Cited

FOREIGN PATENT DOCUMENTS

JP            2011-231550 A    11/2011
JP               3181269 U     1/2013

OTHER PUBLICATIONS

Notice of Reasons for Refusal issued by the Japanese Patent Office in relation to Japanese Application No. 2018-030916 dated Dec. 17, 2019 (5 pages) along with English translation (5 pages).
Second Notice of Reasons for Refusal issued by the Japanese Patent Office in relation to Japanese Application No. 2018-030916 dated Mar. 10, 2020 (4 pages) along with English translation (4 pages).
Decision to Grant a Patent issued by the Japanese Patent Office in relation to Japanese Application No. 2018-030916 dated Jun. 2, 2020 (3 pages) along with English translation (2 pages).

* cited by examiner

FIG. 9

HAND-HELD DEVICE

CROSS-REFERENCE TO RELATED APPLICATION

This application is based upon and claims the benefit of priority from Japanese Patent Application No. 2018-030916 filed on Feb. 23, 2018, the contents of which are incorporated herein by reference.

BACKGROUND OF THE INVENTION

Field of the Invention

The present invention relates to a portable hand-held device that is attachable to and detachable from a metal board.

Description of the Related Art

As a portable hand-held device, for example, an operation device such as a remote controller can be mentioned, and a magnet is used to make such an operation device attachable to and detachable from a metal board. For example, Japanese Laid-Open Patent Publication No. 2011-001718 discloses a detachable structure for a remote controller that performs remote control. This structure uses a magnet to allow the remote controller to be detachably fixed to a wall by the magnetic force of the magnet.

SUMMARY OF THE INVENTION

Meanwhile, in factories and others equipped with a machine tool, there are some cases in which when an operation device for operating the machine tool is not used, the device is attracted to a metal board such as a metal base on which the machine tool is mounted, by a magnet provided on the operation device side.

However, metal chips such as metal pieces and metal powder generated during the machining of the machine tool or the like may stick to the casing of the operation device by the magnetic force of the magnet, and when the device with the metal chips sticking thereto is attached to the metal board, the metal board is liable to be scratched. Further, the task of removing metal chips sticking to the casing of the operation device therefrom tends to be troublesome.

It is therefore an object of the present invention to provide a hand-held device capable of preventing adhesion of metal chips.

According to an aspect of the present invention, a portable hand-held device configured to be attached to and detached from a metal board, includes: a casing; a magnet disposed in the casing; and a moving unit disposed so as to surround the magnet when an attachment face of the casing that is attached to the metal board is viewed from the front, the moving unit being configured to move in a protruding direction in which a distal end portion of the moving unit protrudes from the attachment face when the casing is detached from the metal board.

According to the hand-held device of the above aspect, since the moving unit surrounding the magnet protrudes when the casing is detached from the metal board, it is possible to prevent metal chips from being magnetically attracted to the casing by the magnetic force of the magnet. As a result, adhesion of metal chips can be suppressed.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Hand-held devices according to the present invention will be detailed below by describing preferred embodiments with reference to the accompanying drawings.

Figure 1:
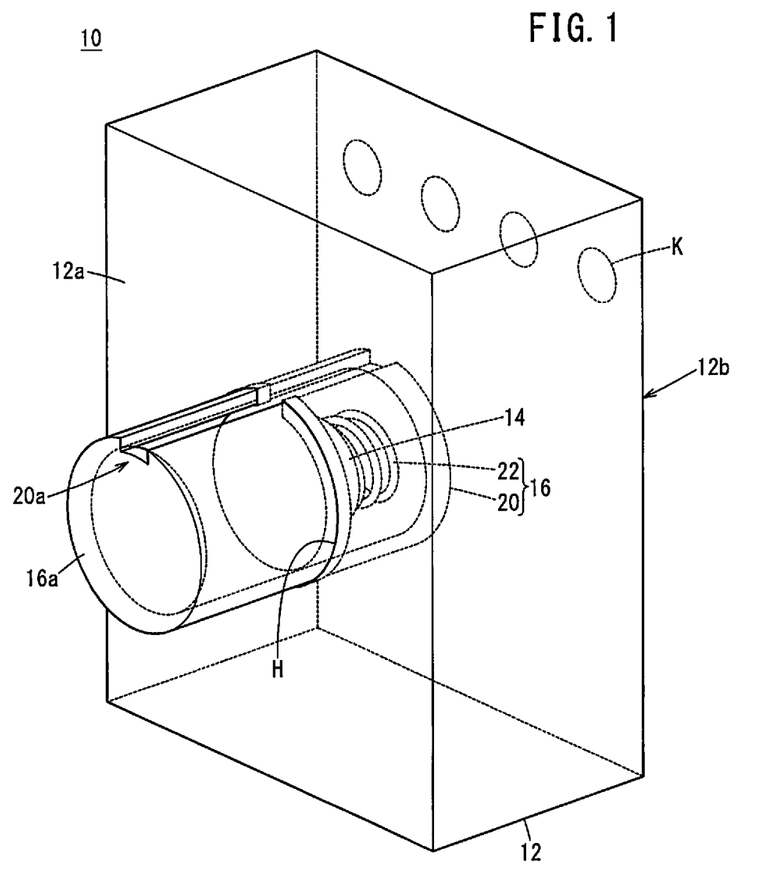
FIG. 1 is a schematic perspective view showing a hand-held device according to an embodiment.

FIG. 1 is a schematic perspective view of a hand-held device 10. The hand-held device 10 is a portable device that is attachable to and detachable from a metal board. In the present embodiment, the hand-held device 10 is an operation device for operating a machine tool such as a cutting device for cutting a workpiece using a tool and an electrical discharge machine for performing electrical discharge machining on a workpiece, and can be attached to and detached from a metal board MB (see FIG. 4) such as a metal base on which the machine tool is mounted.

The hand-held device 10 mainly includes a casing 12, a magnet 14 and a moving unit 16. The casing 12 is a hollow container having an attachment face 12a. The attachment face 12a is a surface of a casing wall of the casing 12 that is attached to the metal board MB. The casing 12 of the present embodiment has an operation panel 12b on the side opposite to the attachment face 12a. A Landolt ring-shaped through hole H is formed in the attachment face 12a, and for example a plurality of operation keys K for operating the machine tool are arranged on the operation panel 12b.

The magnet 14 attracts the metal board MB and is arranged in the casing 12. The magnet 14 of the present embodiment is a disk-shaped permanent magnet, and is arranged inside the casing 12. Specifically, the magnet 14 is fixed to an inner surface of the casing 12 (the back side of the attachment face 12a) inside the Landolt ring-shaped through hole H.

The moving unit 16 is movable in such a direction that a distal end portion 16a comes out from the attachment face 12a of the casing 12 when the casing 12 is detached from the metal board MB. When the magnet 14 attracts the metal board MB, the moving unit 16 moves so that the distal end portion 16*a* retreats toward the attachment face 12*a* of the casing 12.

Figure 2:
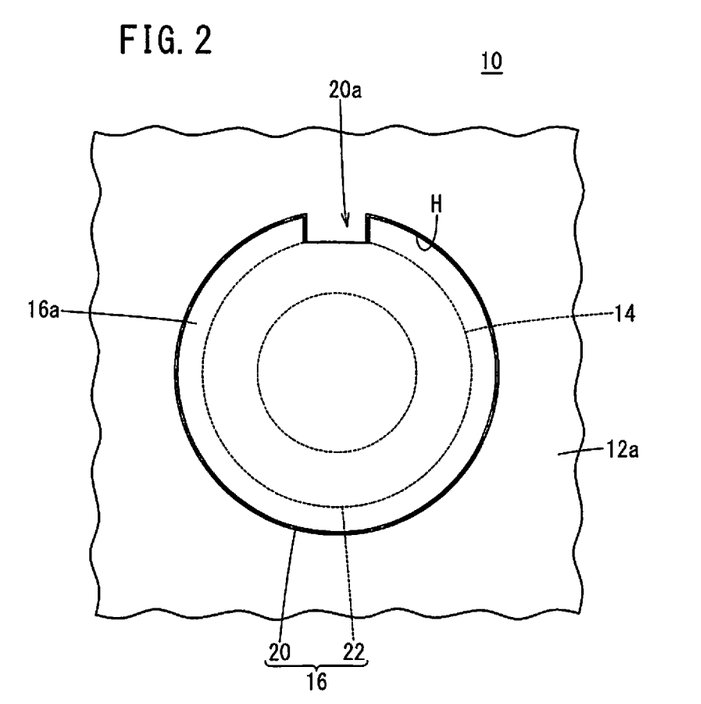
FIG. 2 is a view showing the casing of the hand-held device of FIG. 1 when its attachment face is viewed from front.

FIG. 2 is a view showing a state where the attachment face 12*a* of the casing 12 is viewed from the front. The moving unit 16 is provided so as to surround the magnet 14 when the attachment face 12*a* of the casing 12 is viewed from the front.

Figure 3:
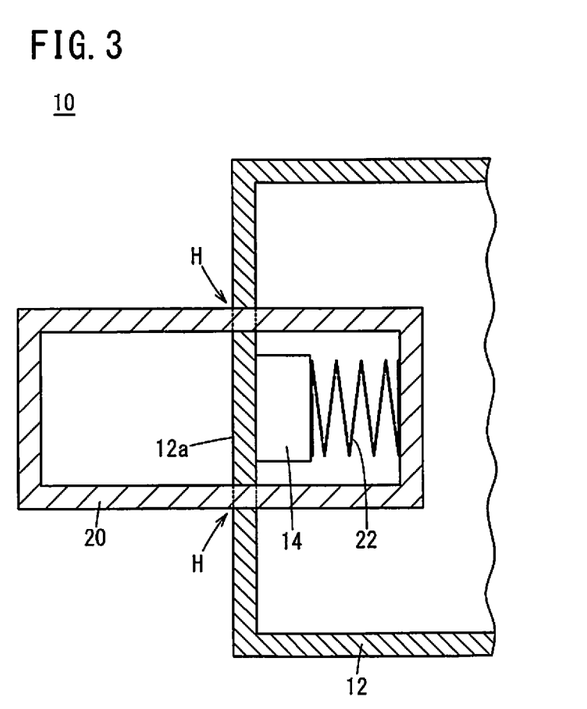
FIG. 3 is a sectional view showing a hand-held device being detached from a metal board.
Figure 4:
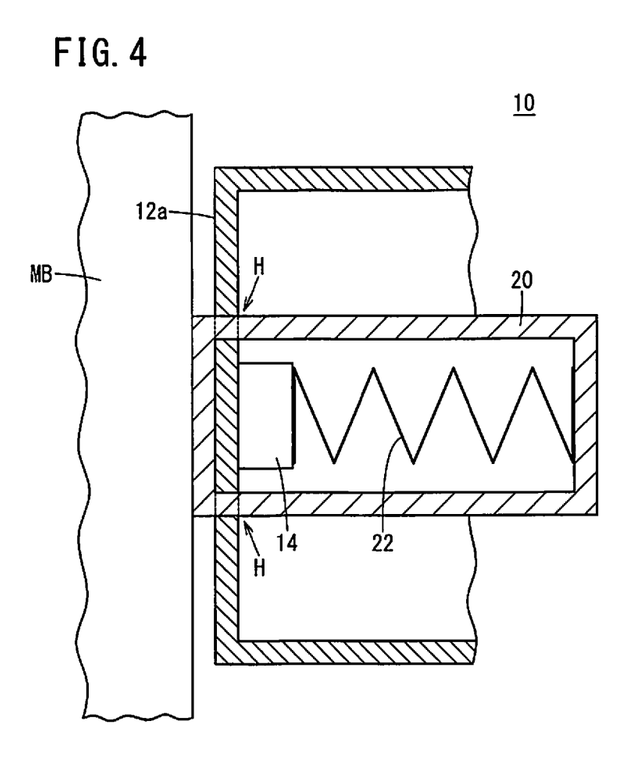
FIG. 4 is a sectional view showing a hand-held device attached to a metal board.

FIG. 3 is a sectional view showing the hand-held device 10 being detached from the metal board MB, and FIG. 4 is a sectional view showing the hand-held device 10 attached to the metal board MB. The moving unit 16 of the present embodiment has a sliding part 20 and an urging element 22.

The sliding part 20 is made of a nonmetallic material such as resin and formed in a tubular shape. The sliding part 20 is provided so as to penetrate the casing 12 and be slidable in the direction of penetration while surrounding the magnet 14.

That is, the sliding part 20 is slidably inserted into the Landolt ring-shaped through hole H so as to surround the magnet 14, leaving a gap between the sliding part 20 and the magnet 14 disposed inside the through hole H. As a result, the sliding part 20 can suppress metal chips from being magnetically attracted toward the casing 12 by magnetic force of the magnet 14.

Here, in order to prevent metal chips from being magnetically attracted toward the attachment face 12*a* of the casing 12 by the magnet 14, the thickness of the tubular sliding part 20, the material of the non-metallic sliding part 20, the gap between the tubular sliding part 20 and the magnet 14 arranged inside the tube, and other factors can be adjusted and set.

The sliding part 20 of this embodiment has a slit 20*a* that extends in the longitudinal direction from one end to the other end (see FIGS. 1 and 2). The slit 20*a* is arranged in between the ends of the Landolt ring-shaped through hole H in a slidable manner. In addition, both the ends of the tubular sliding part 20 in the longitudinal direction are closed. In this sliding part 20 the end disposed outside the casing 12 is the aforementioned distal end portion 16*a*.

When the casing 12 is detached from the metal board MB, the urging element 22 urges the sliding part 20 so that the sliding part 20 moves in a direction in which the sliding part 20 projects out from the attachment face 12*a* of the casing 12 (which will be hereinafter referred to as the protruding direction).

The urging element 22 of the present embodiment is a tension spring connected between the end portion of the sliding part 20 on the inner side of the casing 12 and the magnet 14 disposed inside the tube of the sliding part 20. The urging force (the spring force of the tension spring) of the urging element 22 is smaller than the attraction force of the magnet 14.

That is, the urging element 22 (tension spring) has a natural length in a state (see FIG. 3) where the casing 12 is detached from the metal board MB, and is pulled when the magnet 14 attracts the metal board MB so that the casing 12 is attached to the metal board MB (see FIG. 4). In FIGS. 3 and 4, the tension spring is illustrated with lines for convenience.

Next, the operation of the moving unit 16 will be described. When the casing 12 is detached from the metal board MB (see FIG. 3), the urging element 22 (tension spring) of the moving unit 16 is in a state of natural length, and the sliding part 20 protrudes in the protruding direction. In this detached state, the urging element 22 (tension spring) urges the sliding part 20 in the protruding direction so as to prevent the sliding part 20 from moving inward into the casing 12.

Figure 5:
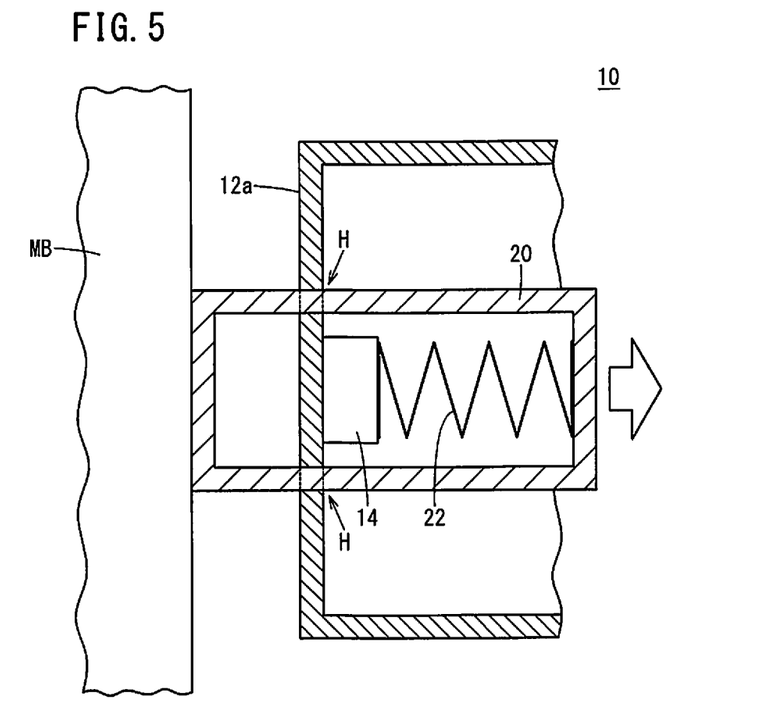
FIG. 5 is a sectional view showing how a sliding part of FIG. 1 operates.

FIG. 5 is a diagram showing how the sliding part 20 moves. When the operator presses the attachment face 12*a* side of the casing 12 against the metal board MB, the sliding part 20 slides in a direction opposite to the protruding direction. As the sliding part 20 is slid by the operator's pressing, the magnet 14 approaches the metal board MB.

When the magnet 14 and the metal board MB approach each other within a certain distance, the magnet 14 attracts the metal board MB. As described above, the spring force of the urging element 22 (tension spring) is smaller than the attraction force of the magnet 14. Therefore, when the magnet 14 attracts the metal board MB, as a result of the attraction, the sliding part 20 slides toward the interior of the casing 12 in the direction opposite to the protruding direction, and the urging element 22 (tension spring) is pulled as a result of the sliding.

When the end portion of the sliding part 20 on the outer side of the casing 12 abuts against the attachment face 12*a* of the casing 12, movement of the sliding part 20 is stopped and a tension state of the urging element 22 (tension spring) is maintained (see FIG. 4).

Here, when the casing 12 is detached from the metal board MB so that the attracting of the magnet 14 is released, the urging element 22 (tension spring) returns from the tension state (see FIG. 4) to the natural length state (see FIG. 3), so that the sliding part 20 slides in the protruding direction. As a result, the distal end portion 16*a* of the moving unit 16 (the sliding part 20) protrudes apart from the attachment face 12*a* of the casing 12.

Thus, in the hand-held device 10, the tubular sliding part 20 surrounding the magnet 14 protrudes when the casing 12 is detached from the metal board MB, whereby it is possible to prevent metal chips from being magnetically attracted toward the casing 12 due to the magnetic force of the magnet 14. Therefore, the hand-held device 10 can prevent adhesion of metal chips.

[Modifications]

Although the above embodiment has been described as an example of the present invention, the technical scope of the present invention should not be limited to the scope described in the above embodiment. It goes without saying that various modifications or improvements can be added to the above embodiment. It is obvious from the description of the scope of the claims that modes with such modifications or improvements can be included in the technical scope of the present invention.

Part of the modified or improved forms will be described below as modifications. Note that the same reference numerals are given to the same components as those described in the above embodiment, and repeated explanation is omitted.

[Modification 1]

Figure 6:
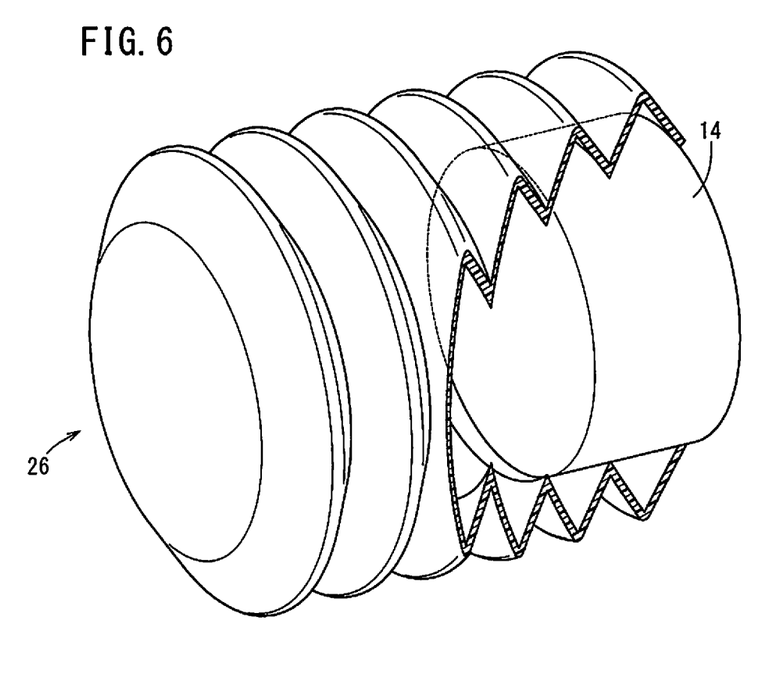
FIG. 6 is a perspective view showing a moving unit of modification 1.

FIG. 6 is a perspective view showing a moving unit 26 of modification 1. In FIG. 6, though part of the moving unit 26 is cut away for convenience of explanation, it is not actually cut off. The moving unit 26 of the modification 1 is different from the moving unit 16 having the sliding part 20 and the urging element 22 in that it is a bellows member. The moving unit 26 is made of a nonmetallic material such as a resin and incorporates a magnet 14.

Figure 7:
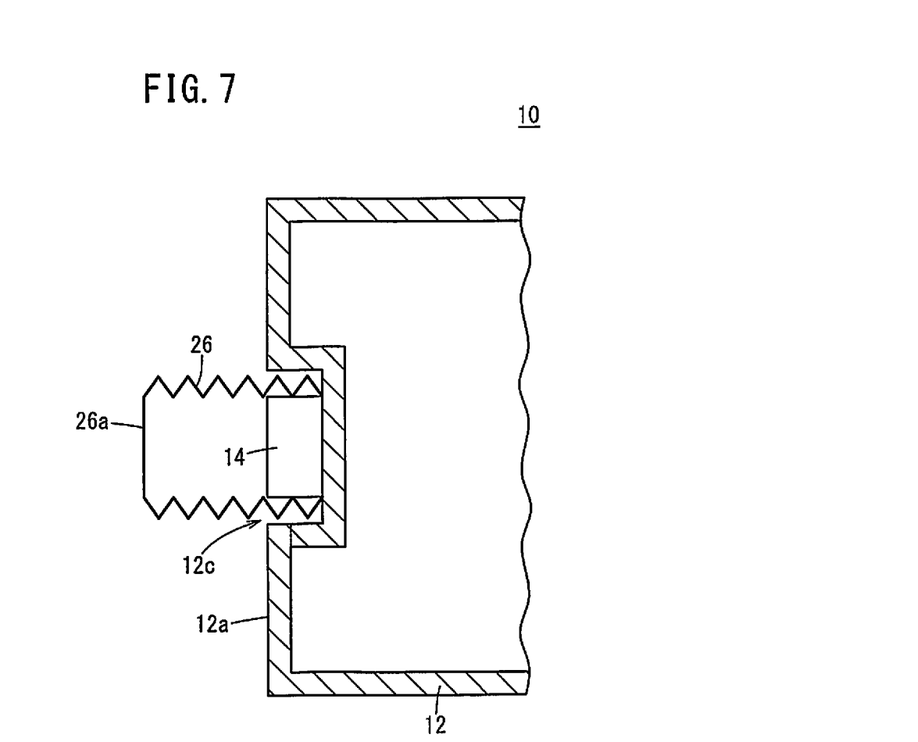
FIG. 7 is a sectional view showing a hand-held device including the moving unit of modification 1, viewed from the same viewpoint as in FIG. 3.
Figure 8:
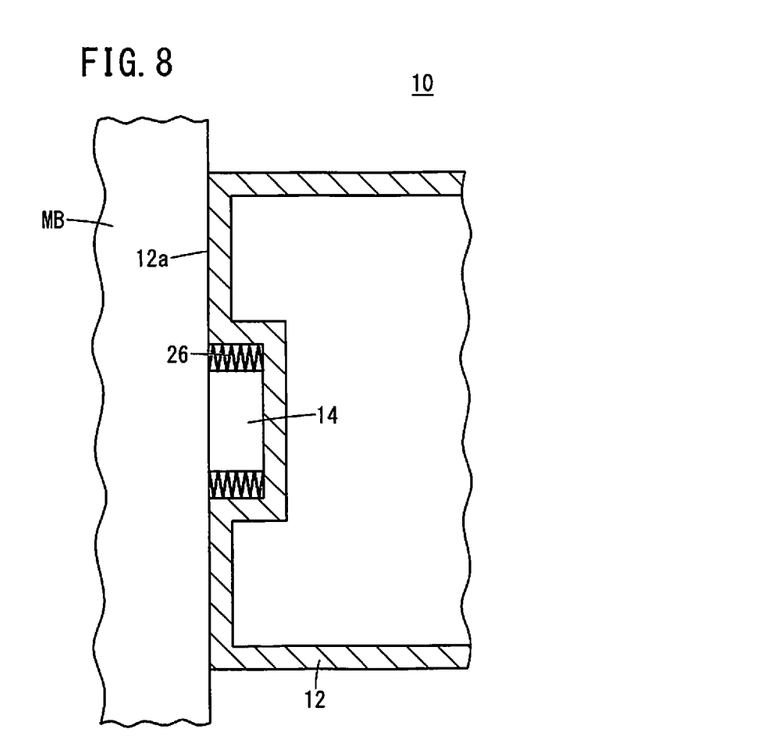
FIG. 8 is a sectional view showing the hand-held device including the moving unit of modification 1, viewed from the same viewpoint as in FIG. 4.

FIG. 7 is a sectional view showing a hand-held device 10 including the moving unit 26 of the modification 1, viewed from the same viewpoint as in FIG. 3. FIG. 8 is a sectional view of the hand-held device 10 including the moving unit 26 of the modification 1, viewed from the same viewpoint as in FIG. 4. The moving unit 26 is arranged on the attachment face 12a side of the casing 12.

Specifically, the moving unit 26 is arranged in a depressed portion 12c formed on the attachment face 12a side of the casing 12, and a magnet 14 is arranged inside a portion of the moving unit 26 that is arranged inside the depressed portion 12c. As a result, the moving unit 26 can prevent metal chips from being magnetically attracted toward the casing 12 by the magnetic force of the magnet 14. The magnet 14 may be fixed to the inner surface of the casing 12 (the inner surface of the depressed portion 12c) as in the above-described embodiment, instead of being incorporated in the moving unit 26.

The moving unit 26 (bellows member) extends in the protruding direction when the casing 12 is detached from the metal board MB. That is, in the detached state (see FIG. 7) where the casing 12 is detached from the metal board MB, the moving unit 26 (bellows member) is in a natural length state and protrudes in the protruding direction from an opening of the depressed portion 12c.

On the other hand, in the attached state (see FIG. 8) where the magnet 14 attracts the metal board MB and the casing 12 is attached to the metal board MB, the moving unit 26 (bellows member) is compressed from the natural length. When the casing 12 is detached from the metal board MB and the attraction of the magnet 14 is released from the attached state, the moving unit 26 (bellows member) moves from the compressed state (see FIG. 8) to the natural length state (FIG. 7) and then extends in the protruding direction. As a result, a distal end portion 26a of the moving unit 26 moves away from the attachment face 12a of the casing 12 and protrudes outward.

Thus, the moving unit 26 (bellows member) compresses itself upon the attachment, that is, the moving unit urges itself so that the moving unit can move in the protruding direction when the casing 12 is detached from the metal board MB. Therefore, when the casing 12 is detached from the metal board MB, the moving unit 26 (bellows member) protrudes from the depressed portion 12c of the casing 12, whereby it is possible to prevent metal chips from being magnetically attracted toward the casing 12 due to the magnetic force of the magnet 14, in the same manner as in the above embodiment.

In this modification 1, in the attachment state (see FIG. 8) where the casing 12 is attached to the metal board MB, the distal end portion 26a of the moving unit 26 (bellows member) is accommodated in the depressed portion 12c. Therefore, no gap is formed between the casing 12 and the metal board MB, so that the casing 12 can be stably attracted to the metal board MB.

[Modification 2]

Figure 9:
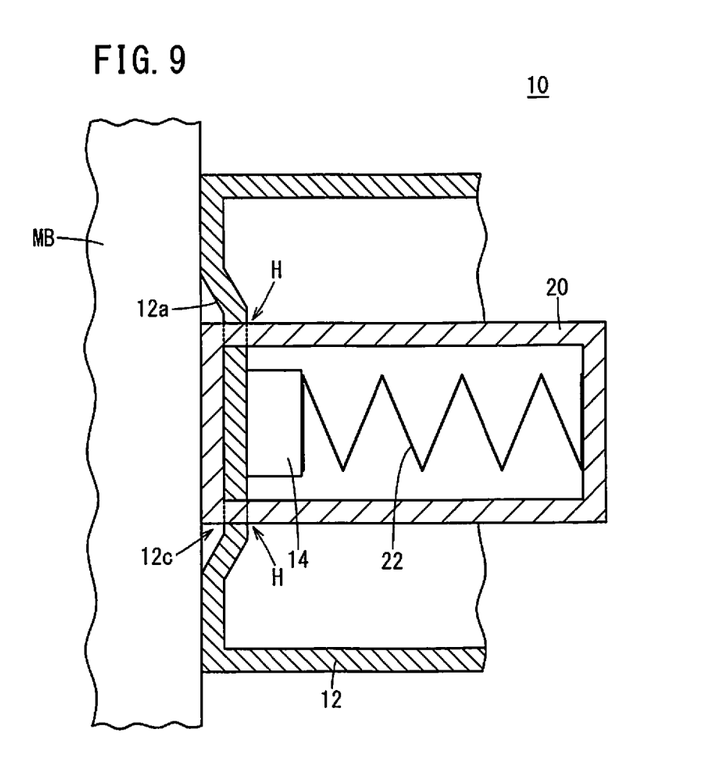
FIG. 9 is a sectional view showing the hand-held device of modification 2, viewed from the same viewpoint as in FIG. 4.

FIG. 9 is a sectional view showing a hand-held device 10 of modification 2, viewed from the same viewpoint as in FIG. 4. The hand-held device 10 of the modification 2 is different from the above embodiment in that it has a depressed portion 12c on the attachment face 12a side of the casing 12, whereas the hand-held device 10 of the above embodiment has no depressed portion 12c.

The sliding part 20 is arranged so as to penetrate the bottom portion of the depressed portion 12c, and is slidable in the penetrating direction while surrounding the magnet 14. Thus, similarly to the above modification 1, in the attached state where the casing 12 is attached to the metal board MB, the distal end portion 16a of the moving unit 16 (the sliding part 20) is accommodated in the depressed portion 12c. Therefore, no gap is formed between the casing 12 and the metal board MB, so that the casing 12 can be stably attracted to the metal board MB.

[Modification 3]

Though, in the above-described embodiment, the hand-held device 10 is an operation device for operating a machine tool, it may be an operation device for operating a machine, an appliance and the like other than machine tools. Further, the hand-held device 10 may be an electronic device not including operation keys K, or may be an appliance that does not include any electronic component. In short, the hand-held device 10 may be any device as long as it is of a portable type that can be attached to and detached from the metal board MB.

[Modification 4]

The above embodiment and modifications 1 to 3 may be arbitrarily combined as long as no inconsistency occurs.

[Technical Ideas]

Technical ideas that can be grasped from the above embodiment and modifications are described below.

The hand-held device (10) is a portable device configured to be attached to and detached from a metal board (MB), and includes a casing (12) and a magnet (14) disposed in the casing (12). The hand-held device (10) further includes a moving unit (16, 26) disposed so as to surround the magnet (14) when an attachment face (12a) of the casing (12) that is attached to the metal board (MB) is viewed from the front, the moving unit being configured to move in a protruding direction in which a distal end portion (16a, 26a) of the moving unit protrudes from the attachment face (12a) when the casing (12) is detached from the metal board (MB).

According to this hand-held device (10), since the moving unit (16) surrounding the magnet (14) protrudes when the casing (12) is detached from the metal board (MB), it is possible to prevent metal chips from being magnetically attracted to the casing (12) by the magnetic force of the magnet (14). As a result, adhesion of metal chips can be suppressed.

The moving unit (16) may include: a tubular sliding part (20) arranged penetrating the casing (12) and configured to be slidable in the penetrating direction while surrounding the magnet (14); and an urging element (22) configured to urge the sliding part (20) so that the sliding part (20) can protrude from the attachment face (12a) when the casing (12) is detached from the metal board (MB). This configuration as well can prevent adhesion of metal chips.

The urging force of the urging element (22) may be smaller than the attraction force of the magnet (14). This makes it possible to keep the casing (12) attached to the metal board (MB) only by the attraction of the magnet (14) to the metal board (MB).

The moving unit (26) may be a bellows member that is arranged on the attachment face (12a) of the casing (12) and configured to extend in the protruding direction from the attachment face (12a) when the casing (12) is detached from the metal board (MB). This configuration as well can prevent adhesion of metal chips.

The magnet (14) may be arranged inside the bellows member. This configuration easily prevents adhesion of metal chips.

A depressed portion (12c) may be formed in the casing (12) so as to accommodate the distal end portion (16a, 26a) therein. In this configuration, no gap is formed between the casing (12) and the metal board (MB), so that the casing (12) can be stably attracted to the metal board (MB).

The hand-held device (10) may be an operation device for operating a machine tool.

What is claimed is:

1. A portable hand-held device configured to be attached to and detached from a metal board, comprising:
   a casing;
   a magnet coupled to the casing; and
   a bellow member that is made of a nonmetallic material, is provided on an attachment face side of the casing, the attachment face being attached to the metal board, incorporates the magnet disposed on the attachment face side, and is compressed toward or extends away from the attachment face, wherein the bellow member is compressed while the magnet attracts the metal board and the casing is attached to the metal board whereas the bellow member extends while the attraction of the magnet with respect to the metal board is released.

2. The hand-held device according to claim 1, wherein a depressed portion is formed in the casing on the attachment face side so as to accommodate the compressed bellow member therein.

3. The hand-held device according to claim 1, wherein the hand-held device has an operation panel for operating a machine tool.

* * * * *